(12) United States Patent
Park et al.

(10) Patent No.: US 8,420,228 B2
(45) Date of Patent: Apr. 16, 2013

(54) ORGANIC ELECTROLUMINESCENCE DISPLAY WITH INTERMEDIATE LAYER AND METHOD FOR FABRICATING THE SAME

(75) Inventors: Sang Tae Park, Seongnam-si (KR); Myung Seop Kim, Seoul (KR); Jae Man Lee, Seoul (KR); Eun Soo Cha, Gwacheon-si (KR); Sung Hoon Pieh, Seoul (KR); Kyung Hoon Lee, Seoul (KR); Chang Je Sung, Seoul (KR)

(73) Assignee: LG Display Co., Ltd., Seoul (KR)

( * ) Notice: Subject to any disclaimer, the term of this patent is extended or adjusted under 35 U.S.C. 154(b) by 838 days.

(21) Appl. No.: 11/783,825

(22) Filed: Apr. 12, 2007

(65) Prior Publication Data

US 2007/0241676 A1    Oct. 18, 2007

(30) Foreign Application Priority Data

Apr. 13, 2006    (KR) .................. 10-2006-0033463

(51) Int. Cl.
*H01L 51/54* (2006.01)
(52) U.S. Cl.
USPC ............ 428/690; 428/917; 313/504; 313/506
(58) Field of Classification Search .................. None
See application file for complete search history.

(56) References Cited

U.S. PATENT DOCUMENTS

| | | | | |
|---|---|---|---|---|
| 5,150,006 A | * | 9/1992 | Van Slyke et al. ............ | 313/504 |
| 6,392,339 B1 | * | 5/2002 | Aziz et al. ..................... | 313/504 |
| 2002/0041151 A1 | * | 4/2002 | Park et al. ..................... | 313/504 |
| 2002/0063525 A1 | * | 5/2002 | Choi et al. ..................... | 313/582 |
| 2002/0086180 A1 | * | 7/2002 | Seo et al. ...................... | 428/690 |
| 2003/0129450 A1 | * | 7/2003 | Radu et al. .................... | 428/690 |
| 2003/0198831 A1 | * | 10/2003 | Oshiyama et al. ............ | 428/690 |
| 2005/0025993 A1 | * | 2/2005 | Thompson et al. ........... | 428/690 |
| 2005/0101064 A1 | * | 5/2005 | Yamazaki et al. ............ | 438/149 |
| 2005/0173700 A1 | | 8/2005 | Liao et al. | |
| 2005/0221121 A1 | * | 10/2005 | Ishihara et al. ............... | 428/690 |
| 2007/0116983 A1 | * | 5/2007 | Kanno et al. .................. | 428/690 |
| 2007/0181887 A1 | | 8/2007 | Kijima et al. | |
| 2007/0182318 A1 | | 8/2007 | Kumaki et al. | |

FOREIGN PATENT DOCUMENTS

| | | |
|---|---|---|
| EP | 1339112 A2 | 8/2003 |
| JP | 2005-285708 A | 10/2005 |
| JP | 2006-013458 A | 1/2006 |
| JP | 2006-073484 A | 3/2006 |
| WO | 2005/011013 A1 | 2/2005 |
| WO | 2005/020643 A1 | 3/2005 |
| WO | 2005076753 A2 | 8/2005 |

OTHER PUBLICATIONS

Japanese Office Action dated Jan. 17, 2012 from counterpart Japanese application.
European Patent Office Communication dated Feb. 17, 2012 from counterpart European application.
Office Action from the Japanese Patent Office dated Jun. 5, 2012 in Japanese counterpart application.

* cited by examiner

*Primary Examiner* — Lynda Salvatore
*Assistant Examiner* — Andrew K Bohaty
(74) *Attorney, Agent, or Firm* — Morgan, Lewis & Bockius LLP

(57) ABSTRACT

Disclosed herein is an organic electroluminescent (EL) device comprising an intermediate layer made of at least one selected from a hole blocking material and an electron blocking material.

10 Claims, 8 Drawing Sheets

White light

FIG. 2
Related Art

| Cathode |
|---|
| Electron injection layer |
| Electron transport layer |
| First light-emitting layer |
| Second light-emitting layer |
| Hole transport layer |
| Hole injection layer |
| Anode |
| Substrate |

FIG. 3

| Cathode |
|---|
| Electron injection layer |
| Electron transport layer |
| First light-emitting layer |
| Intermediate layer |
| Second light-emitting layer |
| Hole transport layer |
| Hole injection layer |
| Anode |
| Substrate |

FIG. 4

| Cathode |
|---|
| Electron injection layer |
| Electron transport layer |
| First light-emitting layer |
| First intermediate layer |
| Second intermediate layer |
| Second light-emitting layer |
| Hole transport layer |
| Hole injection layer |
| Anode |
| Substrate |

FIG. 5

| Cathode |
|---|
| Electron injection layer |
| Electron transport layer |
| First light-emitting layer |
| Mixed intermediate layer |
| Second light-emitting layer |
| Hole transport layer |
| Hole injection layer |
| Anode |
| Substrate |

ORGANIC ELECTROLUMINESCENCE DISPLAY WITH INTERMEDIATE LAYER AND METHOD FOR FABRICATING THE SAME

This application claims the benefit of Korean Patent Application No. 10-2006-0033463 filed on Apr. 13, 2006, which is hereby incorporated by reference as if fully set forth herein.

BACKGROUND OF THE INVENTION

1. Field of the Invention

The present invention relates to an organic electroluminescent (EL) device (hereinafter, referred to simply to as an "organic EL device"). More particularly, the present invention relates to a white light-emitting organic EL device and a method for fabricating the device.

2. Discussion of the Related Art

In general, organic electroluminescent (EL) devices consist of: an anode made of materials, e.g., indium tin oxide (ITO); a cathode made of materials, e.g., aluminum (Al); and functional organic layers sequentially laminated between the anode and the cathode. Upon application of an electric field, organic EL devices emit light. Organic EL devices have advantages in that they can be operated at a relatively low voltage and can be fabricated on flexible transparent substrates. Other advantages of organic EL devices are relatively low power consumption and light-weight.

In particular, research on white light-emitting organic EL devices has been conducted since the end of 1980s. Since white light-emitting organic EL devices can be widely utilized in applications including organic EL source and organic EL illumination, they have been the focus of intense interest lately.

There has been actively developed a variety of methods fabricating for white light-emitting organic EL devices that satisfy the requirements of high color purity, superior color stability, superior optical properties depending upon an electric current, excellent luminous efficiency, long lifetime, and easy fabrication.

A variety of methods for realizing light-emission of white light-emitting organic EL devices will be described.

FIG. 1A illustrates monolayer light-emission realizing white light-emission via a single light-emitting layer. FIG. 1B illustrates multilayer light-emission realizing white light-emission via perpendicular combination of respective colors emitted from a plurality of light-emitting layers. FIG. 1C illustrates color conversion to which a blue light-emitting layer and a fluorescent layer are applied. In the color conversion, light emitted from a blue light-emitting layer undergoes an emission-color change from blue to red via fluorescent radiation derived from a fluorescent layer, thus realizing white light-emission via combination of the blue and red light. FIG. 1D illustrates a microcavity structure utilizing wavelength variation via a plurality of color conversion layers. FIG. 1D illustrates a laminated structure comprising red, green and blue light-emitting organic EL device units.

The multilayer light-emission is most commonly used among these methods.

FIG. 2 is a cross-sectional view illustrating a conventional multilayer light-emission structure of a white light-emitting organic EL device. As shown in FIG. 2, the conventional white light-emitting organic EL device has a structure where a first light-emitting layer and a second light-emitting layer are interposed between an anode and a cathode.

The white light-emitting organic EL device having the multilayer light-emission structure is required to stabilize the interface between adjacent layers (in particular, between adjacent light-emitting layers) to realize the desired CIE chromaticity coordinates for white light and improve luminescence efficiency and lifetime.

That is, the electric charge balance and distribution in the light-emitting layers considerably affect white representation.

In particular, in a case of where heat-treatment involves, it is more important to prevent variation in color representation caused by diffusion of atoms and molecules inside the light-emitting layers.

Accordingly, there has been repeated research to improve color representation, life time and efficiency of white light-emitting organic EL devices. However, substantially no satisfactory results have been achieved. The lifetime and efficiency of organic EL devices still remain a problem.

SUMMARY OF THE INVENTION

Accordingly, the present invention is directed to an organic electroluminescent (EL) device and a method for fabricating the same that substantially obviate one or more problems due to limitations and disadvantages of the related art.

An object of the present invention is to provide an organic electroluminescent (EL) device having high CIE chromaticity coordinates, long lifetime and superior luminescence efficiency.

Another object of the present invention is to provide a method for fabricating the organic electroluminescent (EL) device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic electroluminescent (EL) device comprises an intermediate layer made of at least one selected from a hole blocking material and an electron blocking material.

The organic electroluminescent (EL) device may be a white light-emitting organic electroluminescent (EL) device.

The intermediate layer may consist of a first layer made of a hole blocking material and a second layer made of an electron blocking material. The first layer and the second layer may be sequentially laminated and vise versa. The thickness ratio of the first layer (X) to the second layer (Y) may be X:Y=1-1:100 or X:Y=1:1-100.

The intermediate layer may be made of a mixture of a hole blocking material and an electron blocking material. The hole blocking material (X) and the electron blocking material (Y) may be used in a mixed ratio of is X:Y=1-1:100 or X:Y=1:1-100.

Preferably, the intermediate layer may have a thickness of 0.1 to 100 nm. The hole blocking material may have an absolute value of highest occupied molecular orbital (HOMO) of 5.2 eV or higher, and the electron blocking material has an absolute value of lowest occupied molecular orbital (LOMO) of 3.3 eV or below.

The hole blocking material may be a substituted or unsubstituted 1,10-phenanthroline derivative, or a substituted or unsubstituted carbazole derivative. Alternatively, the hole blocking material may be selected from aromatic and aliphatic tertiary amines.

In another aspect of the present invention, there is provided an organic electroluminescent (EL) device comprising a laminated structure consisting of an anode, a cathode, and a plurality of light-emitting layers interposed between the anode and the cathode, further comprising at least one intermediate layer interposed between the adjacent ones of the light-emitting layers, and the intermediate layer being made of at least one of a hole blocking material and an electron blocking material.

The intermediate layer may include a plurality of intermediate layers respectively interposed between adjacent ones of the light-emitting layers, or a single intermediate layer interposed between selected adjacent ones of the light-emitting layers.

The organic electroluminescent (EL) device may further comprise a buffer layer arranged between the intermediate layer and the associated one of the light-emitting layers. The intermediate layer adjacent to the buffer layer may be made of a hole blocking material and electron blocking material, each selected from inorganic compounds.

In yet aspect of the present invention, there is provided a method for fabricating an organic electroluminescent (EL) device comprising: forming a first electrode on a substrate; forming a plurality of light-emitting layers on the first electrode, and forming at least one intermediate layer made of at least one selected from a hole blocking material and an electron blocking material between the light-emitting layers; and forming a second electrode on the light-emitting layers.

The formation of at least one intermediate layer may be carried out by forming a plurality of intermediate layers respectively between adjacent ones of the light-emitting layers, or forming a single intermediate layer between selected adjacent ones of the light-emitting layers.

The intermediate layer may consist of a first layer made of a hole blocking material and a second layer made of an electron blocking material, wherein the first layer and the second layer are sequentially laminated and vise versa. Alternatively, the intermediate layer may be made of a mixture of a hole blocking material and an electron blocking material.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 2 is a cross-sectional view illustrating a conventional multilayer light-emission structure of a white light-emitting organic EL device;

FIGS. 3 to 6 are cross-sectional views illustrating the structure of organic EL devices according to first to fourth embodiment of the present invention;

DETAILED DESCRIPTION OF THE INVENTION

Figure 1A:
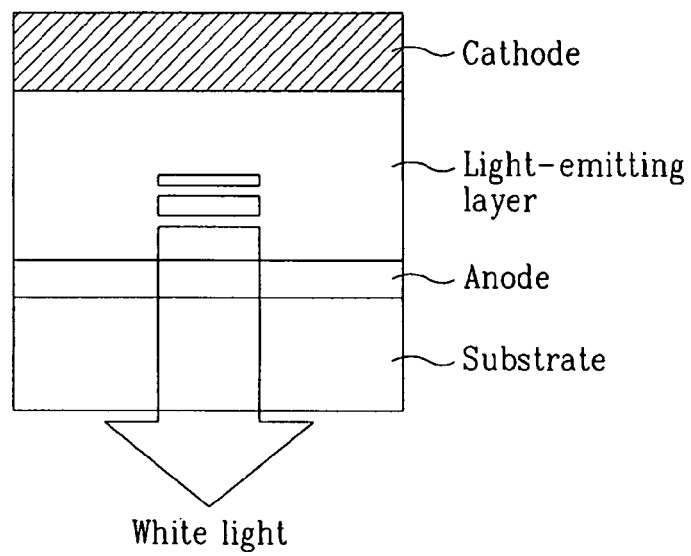
FIG. 1A to 1E are cross-sectional views illustrating general light emission methods of a white light-emitting organic EL device.
Figure 1B:
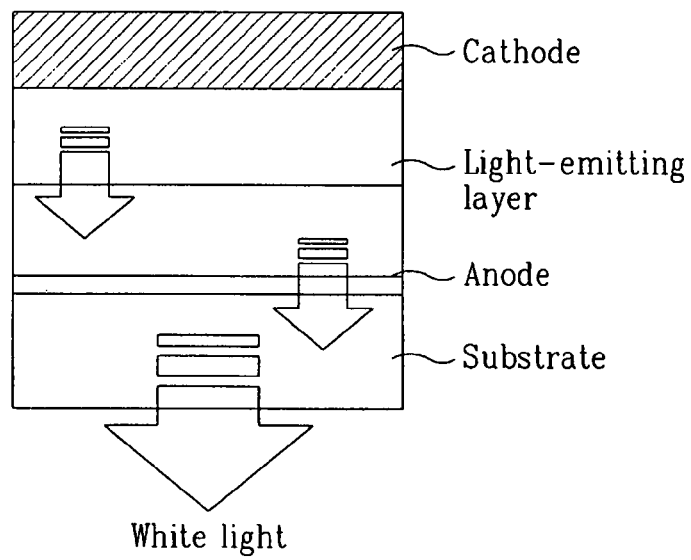
Figure 1C:
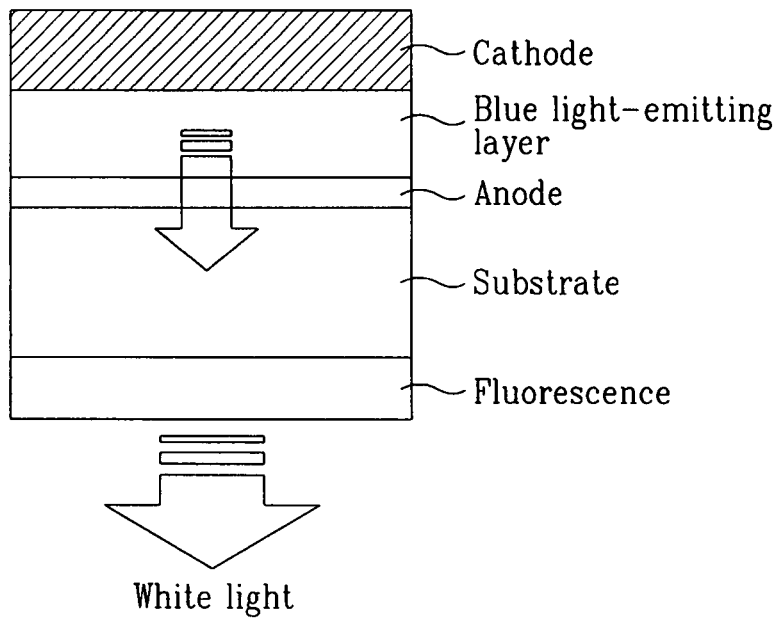
Figure 1D:
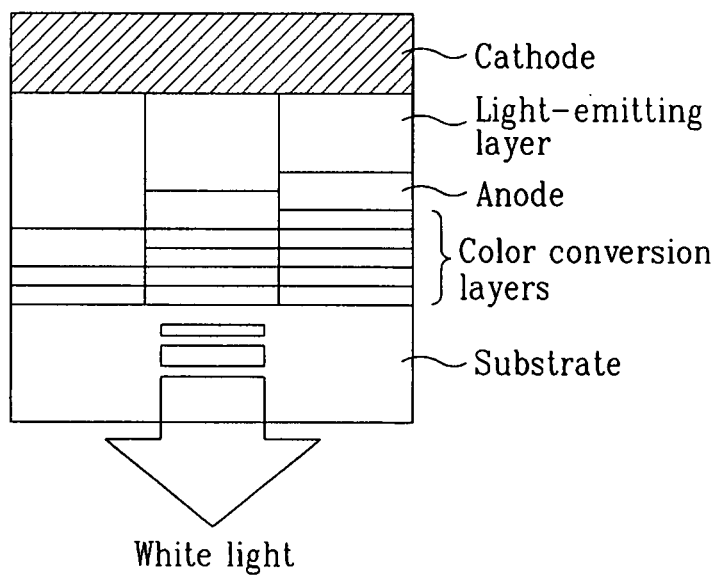
Figure 1E:
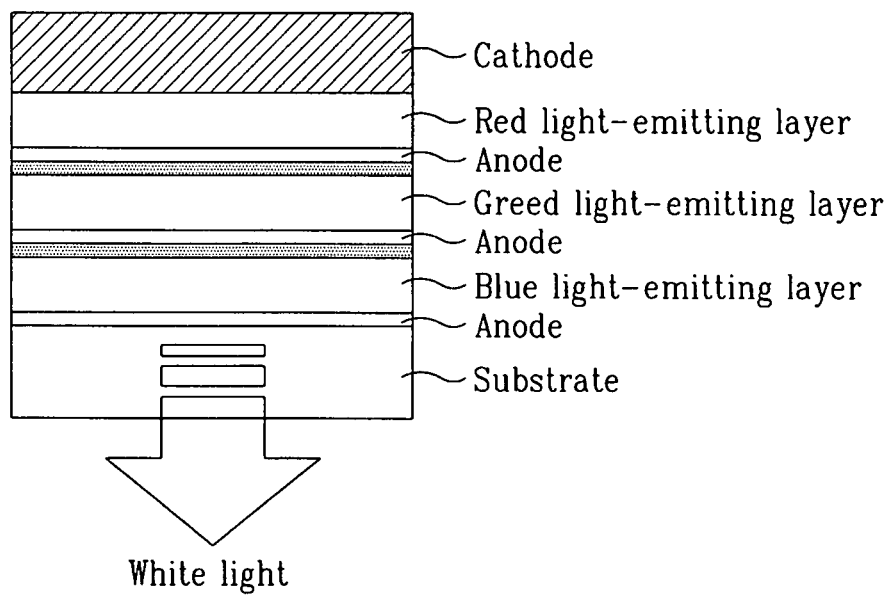

Reference will now be made in detail to the preferred embodiments of the present invention associated with an organic electroluminescent (EL) device and a method for fabricating the organic electroluminescent (EL) device according to the present invention, examples of which are illustrated in the annexed drawings.

Generally, an organic EL device emits light of a specific wavelength, via formation of excitons in a light-emitting layer, based on recombination between holes injected from an anode and electrons injected from a cathode.

Preferably, the organic EL device has a structure in which a hole transport layer (HTL) is interposed between the anode and the light-emitting layer, and an electron transport layer (ETL) is interposed between the cathode and the light-emitting layer.

This structure allows a light-emission region, where the recombination occurs, to be confined within the light-emitting layer, thus imparting high efficiency to the organic EL device.

To optimize luminous efficiency of the organic EL device, it is important to adjust a balance between electrons and holes so that carriers introduced into the light-emitting layer can be excited on the center thereof.

The optimal luminous efficiency can be achieved by controlling the thickness of the respective layers laminated, while taking into the consideration transporting capability of the hole transport layer (HTL) and the electron transport layer (ETL).

When a forward voltage is applied to an organic EL device, in a light-emitting layer, holes injected from an anode (i.e., ITO electrode) are recombined with electrons injected from a cathode to emit light.

Accordingly, internal quantum efficiency of the organic EL device is obtained by the ratio of the number of protons generated inside the device to the number of charges injected from an external electrode. The internal quantum efficiency ($\eta$int) is determined by Equation 1 below:

$$\eta_{int} = Y \eta_r \eta_f \quad (1)$$

wherein Y represents a factor associated with a balance between electron and hole injection; $\eta r$ represents generation efficiency of singlet excitons by electron-hole recombination; and $\eta f$ represents light-emitting quantum efficiency of singlet excitons.

In phosphorescent or fluorescent organic EL devices, the balance between electron and hole injection is maintained to obtain maximum efficiency thereof. This balance factor, Y, is also called a "charge balance factor".

In conventional organic EL devices, excessive holes are injected into the light-emitting layer, as compared to electrons.

The injection of the excessive holes causes deterioration of efficiency. In an attempt to avoid such phenomenon, in a case where holes injected into the emitting layer are blocked, an increase in voltage on an I-V curve disadvantageously occurs.

Generally, the absolute value of highest occupied molecular orbital (HOMO) is about 5.2 eV for a green dopant, about 5 eV for a red dopant, and more than about 5.1 eV for a blue dopant.

Accordingly, a material having a HOMO absolute value of 5.2 eV or higher is preferably used as the hole blocking material, thus serving to block holes and excitons generated in the light-emitting layer.

A method for fabricating a white light-emitting organic EL device which is most well-known in the art may be utilized in the present invention.

That is, the present invention adopts multilayer light-emission as a method for realizing white representation via perpendicular combination of respective colors of light emitted from a plurality of light-emitting layers, and uses an intermediate layer having carrier blocking capability interposed between the light-emitting layers, thereby enabling an improvement in efficiency, lifetime and color representation.

The white light-emitting organic EL device of the present invention has a laminated structure consisting of an anode, a cathode, and a plurality of light-emitting layers interposed between the anode and the cathode.

At least one intermediate layer is interposed between the light-emitting layers. The intermediate layer is made of at least one of a material having hole blocking capability and a material having electron blocking capability.

The intermediate layer includes a plurality of intermediate layers respectively interposed between adjacent ones of the light-emitting layers, or a single intermediate layer interposed between selected adjacent ones of the light-emitting layers.

The intermediate layer consists of a first layer made of the hole blocking material and a second layer made of the electron blocking material. The lamination sequence of the first layer and the second layer is not particularly limited. That is, the first layer and the second layer may be sequentially laminated and vise versa.

The thickness ratio of the first layer (X) to the second layer (Y) is. X:Y=1-1:100 or X:Y=1:1-100.

In some cases, the intermediate layer is made of a mixture of the hole blocking material and the electron blocking material.

The hole blocking material (X) and the electron blocking material (Y) is used in a mixed ratio of X:Y=1-1:100 or X:Y=1:1-100.

Preferably, the intermediate layer has a thickness of about 0.1 to about 100 nm.

In the intermediate layer, the hole blocking material has an absolute value of highest occupied molecular orbital (HOMO) 5.2 eV or higher, and the electron blocking material has an absolute value of lowest occupied molecular orbital (LOMO) 3.3 eV or below.

The hole blocking material may be a substituted or unsubstituted 1,10-phenanthroline derivative, or a substituted or unsubstituted carbazole derivative. Alternatively, the hole blocking material may be a metal complex containing a substituted or unsubstituted 8-hydroxyquinoline. The metal may be selected from aluminum (Al), zinc (Zn), magnesium (Mg) and lithium (Li).

The hole blocking material may be selected from Balq (aluminum(III) bis(2-methyl-8-quinolinato) 4-phenylphenolate), BCP (2,9-dimethyl-4,7-diphenyl-1,10-phenanthroline), CBP [4,4'-N,N'-dicarbazole-1,18-biphenyl], CF—X and CF—Y.

In addition, the electron blocking material may be selected from aromatic and aliphatic tertiary amines.

More specifically, the electron blocking material may be selected from (4,4'-bis[N-(1-napthyl)-N-phenyl-amino]biphenyl), mCP (N,N'-dicarbazolyl-3,5-benzene), and MPMP (bis[4-(N,N-diethylamino)-2-methylphenyl](4-methylphenyl)methane).

The hole blocking and electron blocking materials may be an inorganic compound.

The inorganic compound may be selected from: halides such as LiF, NaF, KF, RbF, CsF, FrF, $MgF_2$, $CaF_2$, $SrF_2$, $BaF_2$, LiCl, NaCl, KCl, RbCl, CsCl, and FrCl; and oxides such as $Li_2O$, $Li_2O_2$, $Na_2O$, $K_2O$, $Rb_2O$, $Rb_2O_2$, $Cs_2O$, $Cs_2O_2$, $LiAlO_2$, $LiBO_2$, $LiTaO_3$, $LiNbO_3$, $LiWO_4$, $Li_2CO$, $NaWO_4$, $KAlO_2$, $K_2SiO_3$, $B_2O_5$, $Al_2O_3$, and $SiO_2$.

The white light-emitting organic EL device further may comprise a buffer layer arranged between the intermediate layer and the associated one of the light-emitting layers.

The intermediate layer adjacent to the buffer layer is made of a hole blocking material and an electron blocking material, each selected from an inorganic compound.

At least one of a hole injection layer and a hole transfer layer may be interposed between the anode and the light-emitting layer. At least one of an electron injection layer and an electron transfer layer may be interposed between the cathode and the light-emitting layer.

The light-emitting layer may include at least phosphorescent material. At least one of the anode and the cathode may be made of a transparent material.

Hereinafter, a method for fabricating the organic EL device according to the present invention will be described in detail.

First, a first electrode is formed on a substrate. A plurality of light-emitting layers are formed on the first electrode.

At least one intermediate layer made of a hole blocking material or an electron blocking material is formed between the light-emitting layers upon the formation of the light-emitting layers.

Finally, a second electrode is formed on the light-emitting layers.

A plurality of intermediate layers are respectively formed between adjacent ones of the light-emitting layers. Alternatively, a single intermediate layer is formed between selected adjacent ones of the light-emitting layers. The intermediate layer is formed by forming a first layer made of a hole blocking material and forming second layer made of an electron blocking material on the first layer. Alternatively, the formation of the intermediate layer may be carried out by forming a first layer made of an electron blocking material and forming a second layer made of a hole blocking material on the first layer.

The intermediate layer may be made of a mixture of a hole blocking material and an electron blocking material.

In some cases, at least one of a hole injection layer and a hole transfer layer may be formed between a first electrode and a light-emitting layer. In addition, at least one of an electron injection layer and an electron transfer layer may be formed between a second electrode and the light-emitting layer.

FIGS. 3 to 6 are sectional views illustrating the structure of organic EL devices according to first to fourth embodiment of the present invention, respectively.

As shown in FIG. 3, the organic EL device according to the first embodiment of the present invention has a laminated structure comprising an anode, an hole injection layer, a hole transfer layer, a second light-emitting layer, an intermediate layer, a first light-emitting layer, an electron transfer layer, an electron injection layer, and a cathode.

That is, the organic EL device has a structure where an intermediate layer is arranged between a first light-emitting layer and a second light-emitting layer As mentioned above, the intermediate layer includes at least one selected from a hole blocking material and an electron blocking material.

As a result, the intermediate layer blocks carrier migration between the first light-emitting layer and the second light-emitting layer, thereby enabling an improvement in efficiency, lifetime, and color representation of the device.

As shown in FIG. 4, the organic EL device according to the second embodiment of the present invention has a structure to which two intermediate layers are applied.

That is, a second intermediate layer made of a hole blocking material is formed on the second light-emitting layer, and a first intermediate layer made of an electron blocking material is formed on the second intermediate layer.

In some cases, the second intermediate layer may be formed on the first intermediate layer.

As shown in FIG. 5, the organic EL device according to the third embodiment of the present invention has a structure in which an intermediate layer made of a mixture of a hole blocking material and an electron blocking material are formed between the first light-emitting layer and the second light-emitting layer.

Figure 6:
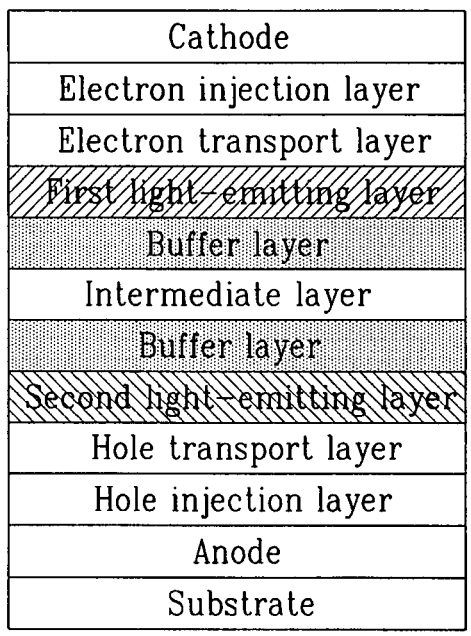

As shown in FIG. 6, the organic EL device according to the fourth embodiment of the present invention has a structure in which a buffer layer is further formed between the intermediate layer and the light-emitting layer.

In this case, the intermediate layer is made of an inorganic compound.

That is, the hole blocking and the electron blocking materials constituting the intermediate layer are selected from inorganic compounds.

The buffer layer arranged between the intermediate layer and the light-emitting layer enables an improvement in carrier blocking performance.

Hereinafter, the characteristics of the organic EL devices according to embodiments of the present invention will be described in detail.

EXAMPLES

The present invention will be described in more detail with reference to the following examples. These examples are provided for illustrative purposes only, and should not be construed as limiting the scope and spirit of the present invention.

Example 1

In Example 1, there were compared IVL characteristics between a white light-emitting organic EL device (Device 2), to which an intermediate layer is applied, and a white light-emitting organic EL device (Device 1), to which no intermediate layer is applied.

First, the device 1 was fabricated as follows:

| ITO | CuPC | NPD | DPVBi | Alq$_3$ + DCJTB | Alq$_3$ | LiF | Al |
|-----|------|-----|-------|-----------------|---------|-----|-----|
| 1500 | 100 | 600 | 150 | 200 (0.7%) | 350 | 5 | 1000 |

The materials for the blue and red light-emitting layers used herein as light-emitting layers were DPVBi and 0.7% DCJTB-doped Alq$_3$, respectively.

The luminescence efficiency and chromaticity coordinate characteristics of the device are measured depending upon variation in the thickness of the blue light-emitting layer while the thickness of the red light-emitting layer is maintained to about 200 Å.

As a result, the highest efficiency of the device 1 was obtained as 5.7 Cd/A at a blue light-emitting layer thickness of 150 Å and a current density of 10 mA/m$^2$. At this time, the CIE chromaticity coordinates for white were x=0.314 and y=0.273.

Meanwhile, there was fabricated a white light-emitting organic EL device (Device 2), to which an intermediate layer made of BALq (25 Å) is interposed between the blue light-emitting layer (150 Å) and the red light-emitting layer (200 Å).

The structure of the device 2 thus fabricated is summarized as follows:

| ITO | CuPC | NPD | DPVBi | BAlq | Alq$_3$ + DCJTB | Alq$_3$ | LIF | Al |
|-----|------|-----|-------|------|-----------------|---------|-----|-----|
| 1500 | 100 | 600 | 150 | 25 | 200 (0.7%) | 350 | 5 | 1000 |

The IVL characteristics of the Devices 1 to 2 were evaluated. The results were shown in Table 1 below.

TABLE 1

| Structure | Voltage (V) | Current density (mA/cm$^2$) | Current efficiency (Cd/A) | Luminance (Cd/m$^2$) | CIE (X) | CIE (Y) |
|---|---|---|---|---|---|---|
| Device 1 (Blue/Red) | 6.1 | 10 | 5.7 | 570 | 0.314 | 0.273 |
| Device 2 (Blue/BAlq/Red) | 6.3 | 10 | 7.2 | 724 | 0.310 | 0.275 |

The device 2 exhibited about 25% increase in efficiency, as compared to the device 1.

As a result, the current efficiency of the device 1 was 7.2 Cd/A at a current density of 10 mA/m$^2$. At this time, the CIE chromaticity coordinates for white were x=0.310 and y=0.275.

Figure 7:
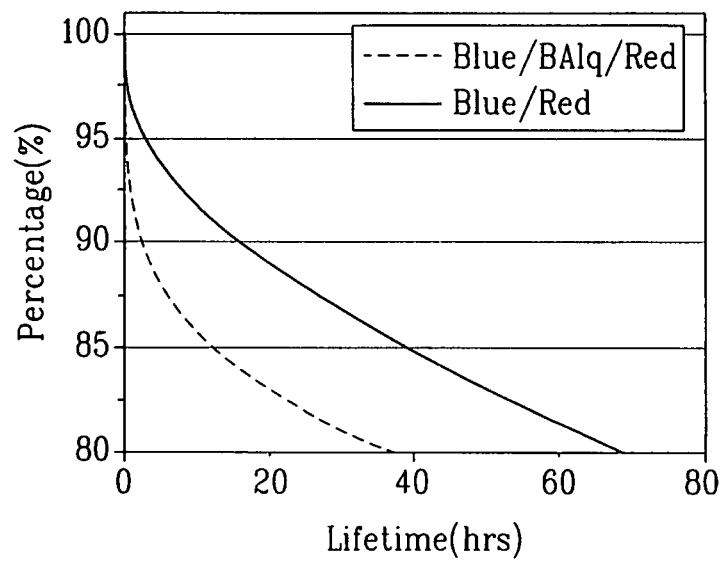
FIG. 7 is a graph illustrating a comparison in lifetime between an organic EL device comprising an intermediate layer and an organic EL device comprising no intermediate layer.

FIG. 7 is a graph illustrating a comparison in the lifetime between the devices shown in Table 1.

As shown in FIG. 7, the device 2, to which the intermediate layer made of BALq is applied, exhibited an improved efficiency, but a reduced lifetime.

Example 2

There were sequentially fabricated three white light-emitting organic devices depending upon the type of an intermediate layer interposed between blue and red light-emitting layers as follows:

(a) Blue/BAlq/Red (Device 3)
(b) Blue/NPD/BAlq/Red (Device 4)
(c) Blue/NPD+BAlq/Red (Device 5)

The Device 3 has a structure where a single layer made of BAlq is used as the intermediate layer. The Device 4 has a structure where double layers consisting of NPD and BAlq layers are used as the intermediate layer. The Device 5 has a structure where a single layer made of a mixture of NPD and BAlq is used as the intermediate layer.

The materials for the blue and red light-emitting layers used herein were PVBi and 0.7% DCJTB-doped Alq$_3$, respectively.

The thickness of the blue and red light-emitting layers was adjusted to about 200 Å and about 150 Å, respectively, in order to offset variation in the CIE chromaticity coordinates caused by the use of the intermediate layer.

The thickness of the intermediate layer was about 50 Å.

The IVL characteristics of the Devices 3 to 5 were evaluated. The results were shown in Table 2 below.

TABLE 2

| Device | Voltage (V) | Current density (mA/cm$^2$) | Current efficiency (Cd/A) | Luminance (Cd/m$^2$) | CIE (X) | CIE (Y) |
|---|---|---|---|---|---|---|
| Device 3 (a) Blue/BAlq/Red | 6.4 | 10 | 7.3 | 724 | 0.309 | 0.275 |
| Device 4 (b)Blue/NPD/BAlq/Red | 6.7 | 10 | 6.2 | 622 | 0.321 | 0.279 |
| Device 5 (c)Blue/NPD + BAlq/Red | 6.2 | 10 | 7.1 | 712 | 0.304 | 0.282 |

The current efficiency, voltage, and CIE chromaticity coordinates of the device 3 were the same as the device 2 of Example 1.

The current efficiency of the device 4 was 6.2 Cd/A at a current density of 10 mA/m$^2$ and a voltage 6.7 V. At this time, the CIE chromaticity coordinates for white were x=0.321 and y=0.279.

The current efficiency of the device 5 was 7.1 Cd/A at a current density of 10 mA/m$^2$ and a voltage 6.2 V. At this time, the CIE chromaticity coordinates for white were x=0.304 and y=0.282.

Figure 8:
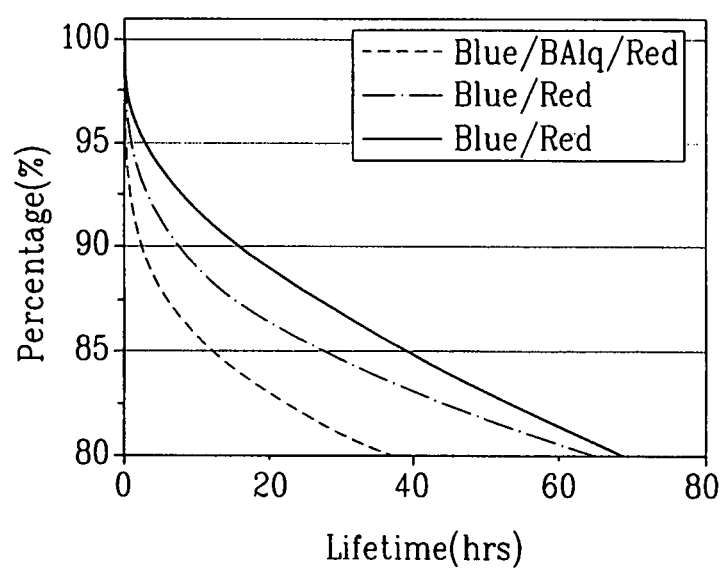
FIG. 8 is a graph illustrating a comparison in lifetime among an organic EL device comprising a single intermediate layer, an organic EL device comprising double intermediate layers, and an organic EL device comprising a single intermediate layer made of a mixture.

FIG. 8 is a graph illustrating a comparison in the lifetime between the devices shown in Table 2.

As shown in FIG. 8, the lifetime (defined as the time taken before the luminance of the organic EL device decreases to 80% its initial value) of the device 3 was 50 hours. The lifetime of the device 4 was about 80 hours (i.e., about 60% increase, as compared to the device 3). The lifetime of the device 5 was about 100 hours (i.e., about 100% increase, as compared to the device 3).

Example 3

There was fabricated a white light-emitting organic device where an intermediate layer made of a mixture of NPD and BAlq is interposed between a blue light-emitting layer and a red light-emitting layer.

The materials for the blue and red light-emitting layers used herein were PVBi and 0.7% DCJTB-doped Alq$_3$, respectively.

The thickness of the blue and red light-emitting layers was adjusted to about 200 Å and about 150 Å, respectively.

The IVL characteristics of the device were evaluated depending upon variation in the mixed ratio of NPD and BAlq. The results are shown in Table 3 below.

TABLE 3

| Structure | Voltage (V) | Current density (mA/cm$^2$) | Current efficiency (Cd/A) | Luminance (Cd/m$^2$) | CIE (X) | CIE (Y) |
|---|---|---|---|---|---|---|
| (a) BAlq + NPD(10:0) | 6.3 | 10 | 7.2 | 724 | 0.304 | 0.281 |
| (b) BAlq + NPD(9:1) | 6.3 | 10 | 7.2 | 717 | 0.302 | 0.280 |
| (c) BAlq + NPD(8:2) | 6.2 | 10 | 7.1 | 712 | 0.304 | 0.282 |
| (d) BAlq + NPD(7:3) | 6.3 | 10 | 7.0 | 703 | 0.299 | 0.282 |

As can be seen from the data in Table 3, as the amount of NPD increases, the current efficiency of the device decreases. On the other hand, as the amount of NPD increases, the lifetime of the device increases.

Figure 9:
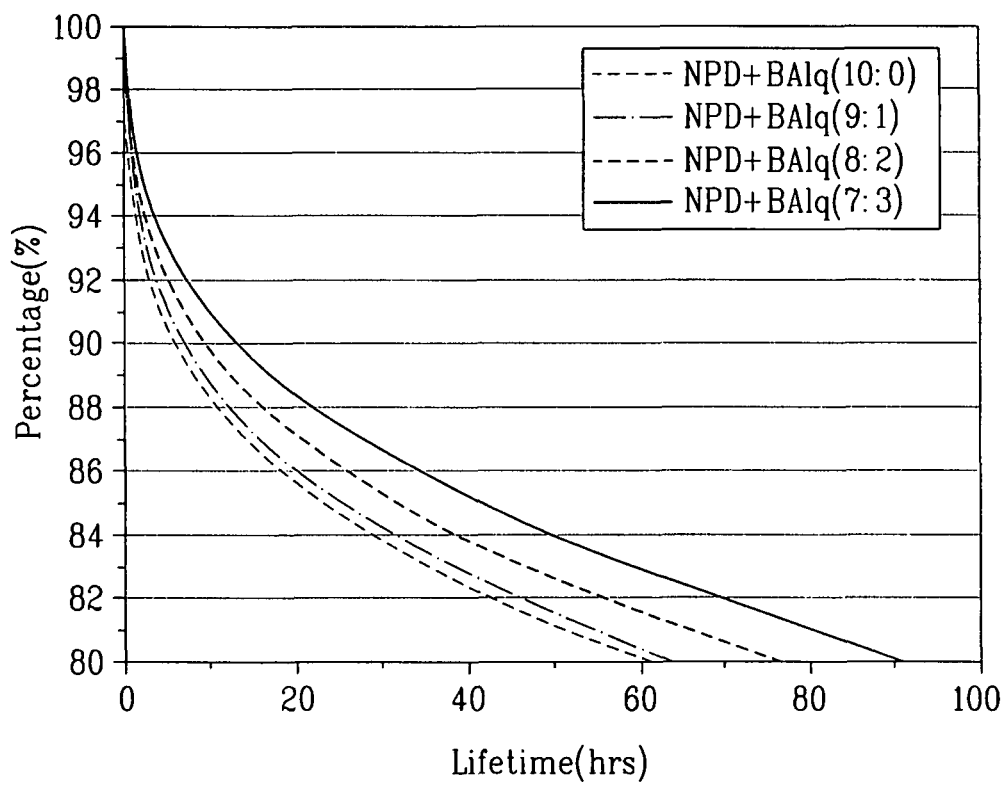
FIG. 9 is a graph illustrating a comparison in organic EL device lifetime depending upon variation in mixed ratio of a single intermediate layer made of a mixture.

FIG. 9 is a graph illustrating a comparison in the device lifetime depending upon variation in mixed ratio of the single intermediate layer made of a mixture.

As shown in FIG. 9, the structure utilizing an intermediate layer containing 30% or higher NPD exhibits about 50% increase, as compared to the structure utilizing an intermediate layer containing no NPD, and the structure utilizing an intermediate layer containing 10% NPD.

In order to control migration of holes and electrons, the multilayer-type white light-emitting organic device, utilizing a double-layer consisting of a hole blocking layer and an electron blocking layer as an intermediate layer interposed between adjacent light-emitting layers, exhibits high efficiency (i.e., about 26% increase) and prolonged lifetime (i.e., about 35% increase), as compared to a white light-emitting organic device utilizing no intermediate layer.

Preferably, the organic electroluminescent (EL) device of the present invention has a driving voltage of 2V or higher, a turn-on voltage of 1 V or higher, and a luminance of 30cd/m2 or higher.

As apparent the foregoing, the organic EL device and the method for fabricating the same according to the present invention enable a considerable improvement in luminescence lifetime, color representation, and luminescence efficiency via an intermediate layer made of at least one selected from a hole blocking material and an electron blocking material interposed between light-emitting layers.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A white light-emitting organic electroluminescent (EL) device comprising:
   first and second organic light emitting layers respectively interposed between an anode and a cathode, wherein the first organic light emitting layer is red light emitting layer formed of DCJBT-doped Alq3, the second organic light emitting layer is blue light emitting layer formed of DPVBi, and the white-light emitting organic electroluminescent device realizes white light emission via combination of blue and red lights;
   a first buffer layer arranged between an intermediate layer and the first light-emitting layer to improve carrier blocking performance;

a second buffer layer arranged between the intermediate layer and the second light-emitting layer to improve carrier blocking performance, wherein the first and second buffer layers arranged between the light-emitting layers; and the intermediate layers having carrier blocking capability respectively interposed between the first and second buffer layers;

wherein the intermediate layers include a hole blocking functioning material and an electron blocking functioning material;

wherein an absolute value of highest occupied molecular orbital (HOMO) of the hole blocking functioning material is 5.2 eV or higher and an absolute value of the lowest occupied molecular orbital of the electron blocking functioning material is 3.3 eV or below;

wherein the proportion of the hole blocking functioning material and the electron blocking functioning material in the intermediate layer is determined such that holes and electrons injected into the organic light emitting layers can be adjusted to optimize luminous efficiency of the organic electroluminescent (EL) device;

wherein the hole blocking functioning material is selected from CF—X, CF—Y and lanthanide compounds.

2. The organic electroluminescent (EL) device according to claim 1, wherein the organic electroluminescent (EL) device has a driving voltage of 2V or higher, a turn-on voltage of 1V or higher, and a luminance of 30cd/m2 or higher.

3. The organic electroluminescent (EL) device according to claim 1, wherein the intermediate layer consists of a first layer made of a hole blocking functioning material and a second layer made of an electron blocking functioning material, wherein the first layer and the second layer are sequentially laminated and vise versa.

4. The organic electroluminescent (EL) device according to claim 3, wherein the thickness ratio of the first layer (X) to the second layer (Y) is X:Y=1-1:100 or X:Y=1:1-100.

5. The organic electroluminescent (EL) device according to claim 1, wherein the intermediate layer is made of a mixture of a hole blocking functioning material and an electron blocking functioning material.

6. The organic electroluminescent (EL) device according to claim 5, wherein the hole blocking functioning material (X) and the electron blocking functioning material (Y) is used in a mixed ratio of X:Y=1-1:100 or X:Y=1:1-100.

7. The organic electroluminescent (EL) device according to claim 1, wherein the intermediate layer has a thickness of 0.1 to 100 nm.

8. The organic electroluminescent (EL) device according to claim 1, wherein at least one of a hole injection layer and a hole transfer layer is interposed between the anode and the light-emitting layer.

9. The organic electroluminescent (EL) device according to claim 1, wherein at least one of an electron injection layer and an electron transfer layer is interposed between the cathode and the light-emitting layer.

10. The organic electroluminescent (EL) device according to claim 1, wherein at least one of the first and second light-emitting layers includes a phosphorescent material.

* * * * *